United States Patent
Sakamoto

(10) Patent No.: US 6,924,245 B2
(45) Date of Patent: Aug. 2, 2005

(54) GLASS CERAMIC COMPOSITION, GLASS CERAMIC SINTERED MATERIAL AND CERAMIC MULTILAYER SUBSTRATE

(75) Inventor: Sadaaki Sakamoto, Kyoto-fu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/442,153

(22) Filed: May 21, 2003

(65) Prior Publication Data

US 2003/0220185 A1 Nov. 27, 2003

(30) Foreign Application Priority Data

May 23, 2002 (JP) ....................... 2002-149546

(51) Int. Cl.[7] ................ C04B 35/465; C03C 10/02; C03C 10/04
(52) U.S. Cl. ............... 501/5; 501/10; 501/32; 501/134; 501/136; 428/426; 428/434
(58) Field of Search ............. 501/5, 10, 32, 501/134, 136; 428/426, 434, 210; 361/321.4, 321.5

(56) References Cited

U.S. PATENT DOCUMENTS

| | | | | |
|---|---|---|---|---|
| 3,676,351 A | * | 7/1972 | Taki et al. ............. | 501/136 |
| 3,785,837 A | * | 1/1974 | Amin ..................... | 501/8 |
| 3,787,219 A | * | 1/1974 | Amin ..................... | 501/32 |
| 3,848,079 A | * | 11/1974 | Amin ..................... | 174/258 |
| 5,801,108 A | | 9/1998 | Huang et al. | |
| 6,447,888 B2 | * | 9/2002 | Suzuki et al. ......... | 428/210 |

FOREIGN PATENT DOCUMENTS

| | | | |
|---|---|---|---|
| GB | 1177681 | * | 1/1970 |
| JP | 2000-264724 | | 9/2000 |

OTHER PUBLICATIONS

Abstract of Swedish Application No. SU 427406, Dec. 1974.

Abstract of Japanese Application No. 2000–264724, Jan. 2001.

* cited by examiner

*Primary Examiner*—Karl Group
(74) *Attorney, Agent, or Firm*—Dickstein, Shapiro, Morin & Oshinsky, LLP.

(57) ABSTRACT

A glass ceramic composition which can be fired at a low temperature and which has a high dielectric constant, a relatively small thermal expansion coefficient and a small temperature coefficient of dielectric constant is provided. The glass ceramic composition contains about 5% to 75% by weight of $TiO_2$ powder, about 5% to 75% by weight of $CaTiSiO_5$ powder and about 15% to 50% by weight of glass powder.

19 Claims, 1 Drawing Sheet

GLASS CERAMIC COMPOSITION, GLASS CERAMIC SINTERED MATERIAL AND CERAMIC MULTILAYER SUBSTRATE

BACKGROUND OF THE INVENTION

1. Field of the Invention

The present invention in particular relates to a glass ceramic composition capable of being fired at about 1,000° C. or less, a glass ceramic sintered material produced by firing the same and a ceramic multilayer substrate using the same.

2. Description of the Related Art

In recent years, the performance of electronic components has been significantly improved in the field of electronics. In particular, regarding information processing equipment typified by mobile communication terminals, personal computers and the like, which support an information-oriented society, the increase in information processing speed has accelerated. Consequently, the so-called multichip module (MCM) has become commercially practical as an electronic component for performing high-speed information processing. In the MCM, semiconductor devices, e.g. LSIs, are mounted at a high density on a ceramic multilayer substrate.

It is desired that the resistivity of a wiring conductor provided between LSIs in such a module is minimized in order to process faint, high-speed signals. Examples of low-resistivity conductors include, for example, silver and copper. As a material for the substrate, a material capable of being simultaneously fired with the low-melting metal, specifically, a material capable of being fired at about 1,000° C. or less, is required, and a glass ceramic composition composed of alumina and borosilicate glass and the like is widely used.

Various composite multilayer substrates have been studied in order to match trends toward further miniaturization and higher frequencies with respect to ceramic multilayer substrates. For example, in Japanese Unexamined Patent Application Publication No. 12-264724, a composite, laminated ceramic electronic component which was constructed by laminating a low-dielectric-constant layer and a high-dielectric-constant layer was proposed. The low-dielectric-constant layer was provided with wirings or equipped with semiconductors and the like, and the high-dielectric-constant layer constitutes a capacitor, resonator or the like.

Regarding the above-mentioned multilayer substrate including a composite of the high-dielectric-constant layer and the low-dielectric-constant layer, the occurrence of cracks and warps in the substrate during the firing must be reduced by decreasing the difference between the thermal expansion coefficients of the layers having the respective dielectric constants. However, the thermal expansion coefficient of the above-mentioned glass ceramic composition composed of alumina and borosilicate glass was about 7 to 8 ppmK$^{-1}$, whereas the thermal expansion coefficient of a conventional high-dielectric-constant material was about 10 ppmK$^{-1}$. Therefore, the above-mentioned problems of cracks and warps in the substrate were not able to be overcome.

Conventional dielectric materials, e.g. $TiO_2$, $SrTiO_3$ and $CaTiO_3$ had high dielectric constants and high Q values. However, the temperature coefficients of dielectric constants were large negative values, and therefore, changes in characteristics of the ceramic multilayer substrate due to ambient temperature changes were not able to be avoided.

SUMMARY OF THE INVENTION

It is an object of the present invention to provide a glass ceramic composition which can be fired at a low temperature and which has a high dielectric constant, a relatively small thermal expansion coefficient and a small temperature coefficient of dielectric constant, as well as to provide a glass ceramic.

A glass ceramic composition according to the present invention contains about 5% to 75% by weight of $TiO_2$, about 5% to 75% by weight of $CaTiSiO_5$ and about 15% to 50% by weight of glass.

Preferably, the above-mentioned glass ceramic composition contains about 20% to 60% by weight of $TiO_2$, about 20% to 60% by weight of $CaTiSiO_5$ and about 15% to 50% by weight of glass.

Preferably, the above-mentioned glass ceramic composition further contains at least one of $Ta_2O_5$ and $Nb_2O_5$ as a secondary component.

More preferably, the above-mentioned glass ceramic composition contains the secondary component composed of at least one of $Ta_2O_5$ and $Nb_2O_5$ at a content of about 4 parts by weight or less relative to 100 parts by weight of the primary components composed of $TiO_2$, $CaTiSiO_5$ and glass.

Preferably, the glass contained in the above-mentioned glass ceramic composition contains $SiO_2$, $B_2O_3$ and $ZnO$.

More preferably, the glass contained in the above-mentioned glass ceramic composition contains about 5% to 50% by weight of $SiO_2$, about 5% to 60% by weight of $B_2O_3$ and about 5% to 65% by weight of $ZnO$.

Preferably, the glass contained in the above-mentioned glass ceramic composition further contains an alkaline earth oxide.

More preferably, the glass contained in the above-mentioned glass ceramic composition contains about 5% to 50% by weight of $SiO_2$, about 5% to 60% by weight of $B_2O_3$, 5% to 65% by weight of $ZnO$ and about 5% to 50% by weight of alkaline earth metal oxide.

In a glass ceramic sintered material according to the present invention, $TiO_2$ crystals and $CaTiSiO_5$ crystals are deposited. Furthermore, the glass ceramic sintered material according to the present invention is produced by firing a glass ceramic composition containing about 20% to 60% by weight of $TiO_2$, about 20% to 60% by weight of $CaTiSiO_5$ and about 15% to 50% by weight of glass, and $TiO_2$ crystals and $CaTiSiO_5$ crystals are deposited in the glass ceramic sintered material.

A ceramic multilayer substrate according to the present invention is composed of a laminate of a first ceramic layer made of the above-mentioned glass ceramic sintered material and a second ceramic layer having a dielectric constant lower than that of the first ceramic layer.

The glass ceramic composition according to the present invention can be fired at a low temperature and has a high dielectric constant, a relatively small thermal expansion coefficient and a small temperature coefficient of dielectric constant.

Consequently, the following effects are exerted when a high-dielectric-constant layer of a composite multilayer substrate, in which a low-dielectric-constant layer and a high-dielectric-constant layer are laminated, is prepared using the glass ceramic composition according to the present invention.

The glass ceramic composition according to the present invention can be fired at a low temperature, and therefore, can be simultaneously fired with a wiring conductor made of a metal, e.g. silver and copper, having a low resistivity.

Since the glass ceramic composition according to the present invention has a high dielectric constant, a capacitor having a large capacitance can be formed with respect to the high-dielectric-constant layer.

The glass ceramic composition according to the present invention has a relatively small thermal expansion coefficient which is close to the thermal expansion coefficient of a glass ceramic composition composed of alumina and borosilicate glass. Consequently, occurrence of cracks and warps in the substrate can be retarded during the firing even when a low-dielectric-constant layer is constructed from the glass ceramic composition composed of alumina and borosilicate glass which has an excellent high-frequency characteristic.

Since the glass ceramic composition according to the present invention has a small temperature coefficient of dielectric constant, a capacitor having stable characteristics with respect to ambient temperature changes can be formed.

The glass ceramic according to the present invention has a high dielectric constant, a relatively small thermal expansion coefficient and a small temperature coefficient of dielectric constant in a manner similar to that in the above-mentioned glass ceramic composition. Consequently, effects similar to that described above are exerted when a high-dielectric-constant layer of a composite multilayer substrate is constructed from this glass ceramic.

DESCRIPTION OF THE PREFERRED EMBODIMENTS

Figure 1:
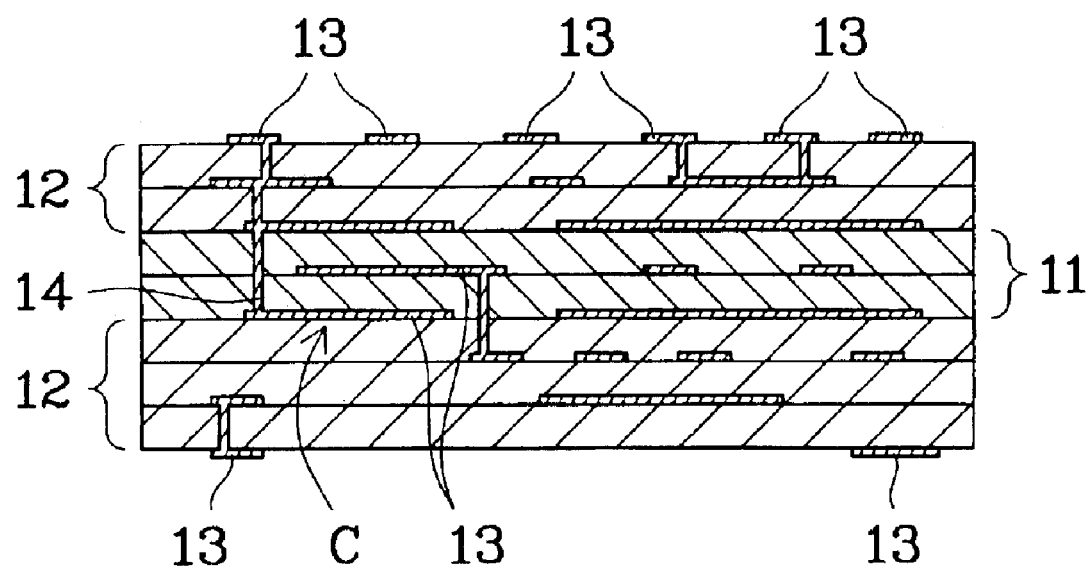
FIG. 1 is a schematic sectional view of a ceramic multilayer substrate according to the present invention.

A glass ceramic composition according to the present invention contains about 5% to 75% by weight of $TiO_2$, about 5% to 75% by weight of $CaTiSiO_5$ and about 15% to 50% by weight of glass. Preferably, each of the above-mentioned $TiO_2$, the above-mentioned $CaTiSiO_5$ and the above-mentioned glass is in a powdery form. That is, the glass ceramic composition according to the present invention may contain about 5% to 75% by weight of $TiO_2$ powder, about 5% to 75% by weight of $CaTiSiO_5$ powder and about 15% to 50% by weight of glass powder. Here, the glass powder is in an amorphous state. However, preferably, each of the $TiO_2$ powder and the $CaTiSiO_5$ powder is a ceramic powder (that is, polycrystalline particles).

The above-mentioned glass ceramic composition contains the glass, and therefore, can be fired in particular at a low temperature of about 1,000° C. or less. Since the above-mentioned glass ceramic composition contains $TiO_2$ having a relative dielectric constant of 120 and $CaTiSiO_5$ having a relative dielectric constant of 45, a glass ceramic sintered material having a high dielectric constant can be produced.

The temperature coefficient of dielectric constant of $TiO_2$ exhibits a large negative value (about $-900$ ppm$K^{-1}$), whereas the temperature coefficient of dielectric constant of $CaTiSiO_5$ exhibits a large positive value (about $+1,500$ ppm$K^{-1}$). Consequently, the resulting glass ceramic sintered material has a small temperature coefficient of dielectric constant because the above-mentioned temperature coefficients of dielectric constants cancel each other.

Since the thermal expansion coefficient of $CaTiSiO_5$ is about 6 ppm$K^{-1}$, the thermal expansion coefficient of the resulting glass ceramic sintered material can be brought close to the thermal expansion coefficient (about 7 to 8 ppm$K^{-1}$) of the glass ceramic sintered material resulting from firing of the glass ceramic composition composed of alumina and borosilicate glass, for example.

The thermal expansion coefficient of the glass ceramic sintered material becomes too small when the content of $TiO_2$ is less than about 5% by weight. Consequently, when the resulting glass ceramic sintered material is used as a high-dielectric-constant layer, the glass ceramic sintered material composed of alumina and borosilicate glass is used as a low-dielectric-constant layer, and the high-dielectric-constant layer and the low-dielectric-constant layer are combined, followed by firing, cracks may occur in the resulting sintered material.

On the other hand, the thermal expansion coefficient of the glass ceramic sintered material becomes too large when the content of $TiO_2$ exceeds about 75% by weight. Consequently, when this glass ceramic sintered material is used as a high-dielectric-constant layer, the glass ceramic sintered material composed of alumina and borosilicate glass is used as a low-dielectric-constant layer, and the high-dielectric-constant layer and the low-dielectric-constant layer are combined, followed by firing, cracks may occur in the resulting sintered material.

The thermal expansion coefficient of the resulting glass ceramic sintered material becomes too large when the content of $CaTiSiO_5$ is less than about 5% by weight. Consequently, when this glass ceramic sintered material is used as a high-dielectric-constant layer, the glass ceramic sintered material composed of alumina and borosilicate glass is used as a low-dielectric-constant layer, and the high-dielectric-constant layer and the low-dielectric-constant layer are combined, followed by firing, cracks may occur in the resulting sintered material.

On the other hand, the thermal expansion coefficient of the glass ceramic sintered material becomes too small when the content of $CaTiSiO_5$ exceeds about 75% by weight. Consequently, when this glass ceramic sintered material is used as a high-dielectric-constant layer, the glass ceramic sintered material composed of alumina and borosilicate glass is used as a low-dielectric-constant layer, and the high-dielectric-constant layer and the low-dielectric-constant layer are combined, followed by firing, cracks may occur in the resulting sintered material.

When the content of the glass is less than about 15% by weight, sinterability of the glass ceramic composition at about 1,000° C. or less may be reduced. On the other hand, when the content of the glass exceeds about 50% by weight, the dielectric constant of the resulting glass ceramic sintered material may be reduced.

The above-mentioned glass ceramic composition preferably contains about 20 to 60% by weight of $TiO_2$. When the content of $TiO_2$ is less than about 20% by weight, the temperature coefficient of dielectric constant of the resulting glass ceramic sintered material may become too large a positive value. On the other hand, when the content of $TiO_2$ exceeds about 60% by weight, the temperature coefficient of dielectric constant of the glass ceramic sintered material may become too large a negative value.

The above-mentioned glass ceramic composition preferably contains about 20% to 60% by weight of $CaTiSiO_5$. When the content of $CaTiSiO_5$ is less than 20% by weight, the temperature coefficient of dielectric constant of the resulting glass ceramic sintered material may become too large a negative value. On the other hand, when the content of CaTiSiO$_5$ exceeds about 60% by weight, the temperature coefficient of dielectric constant of the glass ceramic sintered material may become too large a positive value.

The above-mentioned glass ceramic composition preferably further contains at least one of Ta$_2$O$_5$ and Nb$_2$O$_5$ as a secondary component. When these secondary components are present, the absolute value of the temperature coefficient of dielectric constant of the resulting glass ceramic sintered material can be reduced. The reason for this is believed that a part of Ta$_2$O$_5$ or Nb$_2$O$_5$ diffuses into or form a solid solution with the primary components so as to exert some influence on the temperature coefficient of dielectric constant of the total glass ceramic sintered material during firing.

It, in particular, is preferable that the above-mentioned glass ceramic composition contains the above-mentioned secondary components at a content of about 4 parts by weight or less relative to 100 parts by weight of the primary components composed of TiO$_2$, CaTiSiO$_5$ and glass. In this case, the temperature coefficient of dielectric constant can be adjusted to a small value with almost no reduction in the dielectric constant of the resulting glass ceramic sintered material. However, the dielectric constant of the resulting glass ceramic sintered material may be reduced when the content of the secondary components exceeds about 4 parts by weight.

As the glass contained in the above-mentioned glass ceramic composition, a SiO$_2$—B$_2$O$_3$ based glass and the like can be used. Most of all, SiO$_2$—B$_2$O$_3$—ZnO-based glass having a small thermal expansion coefficient is preferably used.

Preferably, the glass contained in the above-mentioned glass ceramic composition contains about 5% to 50% by weight of SiO$_2$. When the content of SiO$_2$ is less than about 5% by weight, the moisture resistance of the resulting glass ceramic sintered material may be reduced. On the other hand, when the content of SiO$_2$ exceeds about 50% by weight, the melting temperature of the glass may be increased, and therefore, it may become difficult to prepare the glass.

The glass contained in the above-mentioned glass ceramic composition preferably contains about 5% to 60% by weight of B$_2$O$_3$. When the content of B$_2$O$_3$ is less than 5% by weight, the sinterability of the glass ceramic composition at about 1,000° C. or less may be reduced. On the other hand, when the content of B$_2$O$_3$ exceeds about 60% by weight, the moisture resistance of the resulting glass ceramic sintered material may be reduced.

Preferably, the glass contained in the above-mentioned glass ceramic composition contains about 5% to 65% by weight of ZnO. When the content of ZnO is less than about 5% by weight, the effect of reducing the thermal expansion coefficient of the resulting glass ceramic sintered material is not sufficiently exhibited. On the other hand, when the content of ZnO exceeds 65% by weight, the moisture resistance of the glass ceramic sintered material may be reduced.

The glass contained in the above-mentioned glass ceramic composition preferably further contains an alkaline earth metal oxide. Since the alkaline earth metal oxide, e.g. MgO, CaO and SrO, has a small thermal expansion coefficient, the thermal expansion coefficient of the resulting glass ceramic sintered material can be reduced.

Preferably, the glass contained in the above-mentioned glass ceramic composition contains about 5% to 50% by weight of alkaline earth metal oxide. When the content of the alkaline earth metal oxide is less than about 5% by weight, an effect of reducing the thermal expansion coefficient of the resulting glass ceramic sintered material is not sufficiently exhibited. On the other hand, when the content of the alkaline earth metal oxide exceeds about 50% by weight, the moisture resistance of the glass ceramic sintered material may be reduced.

In a glass ceramic sintered material according to the present invention, TiO$_2$ crystals, CaTiSiO$_5$ crystals and glass crystals are deposited. This glass ceramic can be produced by firing the above-mentioned glass ceramic composition, for example. This glass ceramic has a high dielectric constant, a relatively small thermal expansion coefficient and a small temperature coefficient of dielectric constant in a manner similar to that of the above-mentioned glass ceramic composition.

The glass ceramic composition according to the present invention may contain a known solvent, binder and the like. For example, about 1 to 30 parts by weight of solvent can be added relative to 100 parts by weight of the glass ceramic composition, and about 3 to 30 parts by weight of binder can be added relative to 100 parts by weight of the glass ceramic composition.

A ceramic multilayer substrate according to the present invention will be described with reference to FIG. 1.

FIG. 1 is a schematic sectional view showing an example of a ceramic multilayer substrate according to the present invention. A ceramic multilayer substrate 10 is composed of a laminate of first ceramic layers 11 and second ceramic layers 12. Wiring conductors 13 are provided on the primary surface of the ceramic multilayer substrate 10 and between the ceramic layers. Via conductors 14 for three-dimensionally connecting the wiring conductors 13 are provided in each ceramic layer. A capacitor C is constructed from the wiring conductors 13 facing each other with the first ceramic layer 11 therebetween.

The first ceramic layer 11 is prepared by firing a glass ceramic composition containing about 20% to 60% by weight of TiO$_2$, about 20% to 60% by weight of CaTiSiO$_5$ and about 15% to 50% by weight of glass, and is composed of a glass ceramic sintered material in which TiO$_2$ crystals and CaTiSiO$_5$ crystals are deposited. This glass ceramic sintered material contains TiO$_2$ crystals, and therefore, has a high dielectric constant. Consequently, a capacitor having a high dielectric constant can be formed with respect to the first ceramic layer 11. Since this glass ceramic has a small temperature coefficient of dielectric constant, variations in the characteristics of the capacitor C due to ambient temperature changes can be reduced. Since this glass ceramic sintered material contains CaTiSiO$_5$ crystals, the thermal expansion coefficient is relatively small and on the order of 6.5 to 8.5 ppmK$^{-1}$.

The second ceramic layer 12 is composed of a glass ceramic sintered material containing alumina and borosilicate glass. Since this glass ceramic sintered material has a low dielectric constant, the thermal expansion coefficient of this glass ceramic sintered material is about 7 to 8 ppmK$^{-1}$, and therefore, signals can be propagated with no delay in the wiring conductor 13 and the via conductor 14 provided in the second ceramic layer 12. In this manner, a second ceramic layer 12 excellently matching the first ceramic layer 11 of the present invention is a glass ceramic sintered material having a thermal expansion coefficient nearly equivalent to that of the first ceramic layer 11, that is, the thermal expansion coefficient is on the order of 6.5 to 8.5 ppmK$^{-1}$.

The glass ceramic sintered material constituting the first ceramic layer 11 and the glass ceramic sintered material constituting the second ceramic layer 12 have thermal expansion coefficients close to each other. Therefore, occurrence of cracks and warps in the substrate due to the difference in the thermal expansion coefficients of the two ceramic layers can be retarded or prevented during the firing step in the manufacturing process of the ceramic multilayer substrate 10.

The ceramic multilayer substrate 10 is manufactured by the following method, for example. A $SiO_2$—$B_2O_3$—ZnO-based glass powder, a $TiO_2$ powder and a $CaTiSiO_5$ powder are prepared, and these are mixed at a predetermined weight ratio. An appropriate amounts of solvent, binder and plasticizer are added to the resulting mixed powder, followed by kneading, so as to prepare a slurry. The resulting slurry is molded into a sheet by the doctor blade method, and therefore, a first green sheet to become the first ceramic layer 11 by firing is prepared.

A $SiO_2$—$B_2O_3$-based glass powder and an $Al_2O_3$ powder are prepared, and these are mixed at a predetermined weight ratio. An appropriate amounts of solvent, binder and plasticizer are added to the resulting mixed powder, followed by kneading, so as to prepare a slurry. The resulting slurry is molded into a sheet by the doctor blade method, and therefore, a second green sheet to become the second ceramic layer 12 by firing is prepared.

A conductor paste composed of a conductive powder, e.g. a Cu powder or an Ag powder, and an appropriate amount of binder, glass powder and dispersing agent is prepared. The resulting conductor paste is printed on the first and second green sheets by screen printing. Via holes are formed in the first and second green sheets, and these via holes are filled in with the above-mentioned conductor paste.

The first green sheets and the second green sheets are laminated, and therefore, a ceramic laminate provided with wiring conductors and via hole conductors is prepared. Subsequently, the ceramic laminate is pressure-bonded with a pressing machine, and the resulting ceramic laminate is fired in an oxidizing atmosphere, e.g. in air, at 780° C. to 1,000° C., preferably, at about 900° C. In this manner, the ceramic multilayer substrate 10 shown in FIG. 1 is manufactured.

EXAMPLES

The glass ceramic composition and the glass ceramic sintered material of the present invention will be described below with reference to examples.

Each of oxide powders of $SiO_2$, $B_2O_3$, ZnO, MgO, CaO, SrO, BaO, $Li_2O$, $Na_2O$, $K_2O$, $ZrO_2$ and $Al_2O_3$ was prepared. Each of the oxide powders was weighed in accordance with the compositional ratio shown in the following Table 1, followed by mixing. The resulting mixture was put into a platinum crucible, and was melted at 1,100° C. to 1,500° C. for 30 minutes. The resulting molten material was flowed onto a quenching roll so as to prepare glass cullet. The resulting glass cullet was roughly pulverized. Ethanol was added, and subsequently, pulverization was performed in a ball mill including alumina balls of 1 to 10 mm diameter, so that Samples G1 to G24 of glass powders having center particle diameters of about 1 μm were prepared. For each Sample, a part of the quenched glass cullet was put into a lehr for slow cooling from 500° C. to room temperature so as to sufficiently relieve strain, and was cut into a prism of 3 mm×15 mm×1 mm. The average thermal expansion coefficient a (ppmK−1) in a temperature range of room temperature to 500° C. was measured with a dilatometer. The results thereof are shown in Table 1.

TABLE 1

| | $SiO_2$ (wt %) | $B_2O_3$ (wt %) | ZnO (wt %) | MgO (wt %) | CaO (wt %) | SrO (wt %) | BaO (wt %) | $Li_2O$ (wt %) | $Na_2O$ (wt %) | $K_2O$ (wt %) | $ZrO_2$ (wt %) | $Al_2O_3$ (wt %) | A (ppmK$^{-1}$) |
|---|---|---|---|---|---|---|---|---|---|---|---|---|---|
| G1 | 15 | 20 | — | — | 40 | — | — | — | — | — | — | 20 | 8.5 |
| G2 | 20 | 40 | — | 40 | — | — | — | — | — | — | — | — | 9.2 |
| G3 | 35 | 60 | — | — | — | — | — | — | — | 5 | — | — | 9.1 |
| G4 | 5 | 30 | 65 | — | — | — | — | — | — | — | — | — | 6.1 |
| G5 | 10 | 40 | 50 | — | — | — | — | — | — | — | — | — | 6.8 |
| G6 | 30 | 60 | 10 | — | — | — | — | — | — | — | — | — | 7.2 |
| G7 | 35 | 55 | 5 | — | — | — | — | 5 | — | — | — | — | 8.3 |
| G8 | 5 | 20 | 50 | — | 25 | — | — | — | — | — | — | — | 6.7 |
| G9 | 10 | 30 | 40 | — | 20 | — | — | — | — | — | — | — | 6.7 |
| G10 | 20 | 40 | 20 | — | 20 | — | — | — | — | — | — | — | 7.2 |
| G11 | 25 | 50 | 10 | — | 15 | — | — | — | — | — | — | — | 7.4 |
| G12 | 30 | 60 | 5 | — | 5 | — | — | — | — | — | — | — | 7.5 |
| G13 | 10 | 30 | 40 | — | 15 | — | — | — | — | — | — | 5 | 7.3 |
| G14 | 35 | 50 | 5 | — | 5 | — | — | — | — | 2 | — | — | 7.9 |
| G15 | 15 | 35 | 20 | — | 25 | — | — | — | — | — | 5 | — | 7.1 |
| G16 | 20 | 35 | 40 | 5 | — | — | — | — | — | — | — | — | 6.5 |
| G17 | 25 | 40 | 20 | 15 | — | — | — | — | — | — | — | — | 6.9 |
| G18 | 35 | 40 | 15 | 5 | — | — | — | 5 | — | — | — | — | 7.3 |
| G19 | 10 | 20 | 50 | 10 | 10 | — | — | — | — | — | — | — | 6.3 |
| G20 | 5 | 30 | 50 | — | — | 15 | — | — | — | — | — | — | 6.9 |
| G21 | 5 | 30 | 50 | — | — | — | 15 | — | — | — | — | — | 7.2 |
| G22 | | | | | | | | | | | | | |
| G23 | 10 | 40 | 20 | — | 25 | — | 5 | — | — | — | — | — | 8.1 |
| G24 | 35 | 25 | 10 | — | — | 15 | 5 | 10 | — | — | — | — | 8.5 |

Each of CaO, $TiO_2$ and $SiO_2$ oxide powders was prepared, and these were blended at a mole ratio of 1:1:1, followed by calcining at 1,250° C. for 1 hour. The resulting calcined material was roughly pulverized. Ethanol was added, and subsequently, pulverization was performed in a ball mill including alumina balls of 1 to 10 mm diameter, so that a $CaTiSiO_5$ powder was prepared.

In addition to the above-mentioned $CaTiSiO_5$ powder, each of $TiO_2$, $CaTiO_3$, $SrTiO_3$, $Ta_2O_5$, $Nb_2O_5$ and $Al_2O_3$ oxide powders and the above-mentioned glass powders of G1 to G24 were prepared. These were weighed in accordance with weight ratios shown in the following Table 2 to Table 5, followed by mixing, so that Samples S1 to S78 were prepared. An appropriate amounts of solvent, binder and plasticizer were added to the resulting each Sample, followed by kneading, so as to prepare a slurry. The resulting slurry was molded into a green sheet of 50 μm thickness by the doctor blade method.

An Ag paste was printed on the green sheet by screen printing, and the resulting green sheet was cut into the shape of a square of 10 mm×10 mm. Ten sheets of the resulting square green sheets were laminated, and were pressure-bonded with a pressing machine, followed by firing in air at 900° C. for 20 minutes. External electrodes made of Ag were baked onto both end surfaces of the resulting sintered material, and therefore, a monolithic capacitor was prepared. Subsequently, the relative dielectric constant εr of the monolithic capacitor was measured at 1 MHz with an LCR meter. The monolithic capacitor was put into a constant temperature bath, and the temperature coefficient of dielectric constant TCC (ppmK$^{-1}$) in a temperature range of −55° C. to 125° C. was measured with the LCR meter. The results thereof are shown in Table 2 to Table 5.

Furthermore, the above-mentioned green sheets of 50 μm thickness containing respective Samples were cut into the shape of a square of 30 mm×30 mm. Forty sheets of the resulting square green sheets were laminated, and were pressure-bonded with a pressing machine, followed by firing in air at 900° C. The resulting sintered material was cut into a prism of 3 mm×15 mm×1 mm. The average thermal expansion coefficient α (ppmK$^{-1}$) in a temperature range of room temperature to 500° C. was measured with a dilatometer. The results thereof are also shown in Table 2 to Table 5.

The above-mentioned prisms were pulverized so as to prepare a glass ceramic powder. This glass ceramic powder was analyzed with XRD (X-ray diffraction method). As a result, deposition of crystals of each of TiO$_2$ and CaTiSiO$_5$ were identified in each of the glass ceramic powders except for Samples S1 and S14.

Furthermore, the above-mentioned green sheets of 50 μm thickness containing respective Samples were cut into the shape of a square of 100 mm×100 mm. A green sheet containing Sample S78 was laminated on each of the green sheets containing Samples S1 to S77, respectively, and 9 sheets of the green sheet containing Sample S78 were further laminated thereunder. Pressure-bonding was performed with a pressing machine, and therefore, a laminate was prepared. The resulting laminate was fired in air at 900° C. The resulting glass ceramic sintered material was observed with respect to occurrence of cracks and warps. The results thereof are also shown in Table 2 to Table 5.

An asterisked sample in any of the following tables is outside the scope of the invention.

TABLE 2

| | Ceramic | | Glass | | Ta$_2$O$_5$ | Nb$_2$O$_5$ | | | | |
|---|---|---|---|---|---|---|---|---|---|---|
| | TiO$_2$ (wt %) | CaTiSiO$_5$ (wt %) | (wt %) | Type | (part by weight) | (part by weight) | εr | TCC (ppmK$^{-1}$) | α (ppmK$^{-1}$) | Warp (μm) |
| *S1 | 77 | 3 | 20 | G1 | — | — | 61 | −430 | 9.3 | Crack |
| S2 | 75 | 5 | 20 | G1 | — | — | 57 | −350 | 9.1 | 1000 |
| S3 | 70 | 10 | 20 | G1 | — | — | 55 | −278 | 8.9 | 800 |
| S4 | 65 | 15 | 20 | G1 | — | — | 54 | −232 | 8.7 | 700 |
| S5 | 60 | 20 | 20 | G1 | — | — | 52 | −196 | 8.6 | 600 |
| S6 | 50 | 30 | 20 | G1 | — | — | 50 | −173 | 8.2 | 500 |
| S7 | 45 | 35 | 20 | G1 | — | — | 47 | −162 | 8.0 | 400 |
| S8 | 40 | 40 | 20 | G1 | — | — | 45 | +168 | 7.9 | 300 |
| S9 | 30 | 50 | 20 | G1 | — | — | 42 | +184 | 7.5 | 200 |
| S10 | 20 | 60 | 20 | G1 | — | — | 38 | +200 | 7.3 | 100 |
| S11 | 15 | 65 | 20 | G1 | — | — | 32 | +224 | 7.0 | 300 |
| S12 | 10 | 70 | 20 | G1 | — | — | 30 | +245 | 6.9 | 400 |
| S13 | 5 | 75 | 20 | G1 | — | — | 28 | +278 | 6.8 | 500 |
| *S14 | 3 | 77 | 20 | G1 | — | — | 26 | +304 | 6.6 | Crack |
| S15 | 43 | 37 | 20 | G1 | — | — | 47 | +154 | 8.0 | 400 |
| S16 | 43 | 37 | 20 | G1 | 4.0 | — | 45 | +63 | 7.9 | 400 |
| S17 | 43 | 37 | 20 | G1 | — | 4.0 | 45 | +61 | 7.9 | 400 |
| S18 | 46 | 39 | 15 | G2 | — | — | 58 | −188 | 7.9 | 400 |
| S19 | 46 | 39 | 15 | G2 | 4.0 | — | 56 | −88 | 7.8 | 300 |
| S20 | 46 | 39 | 15 | G2 | — | 4.0 | 56 | −82 | 7.8 | 300 |
| *S21 | 49 | 41 | 10 | G2 | — | — | — | — | — | — |
| S22 | 37 | 33 | 30 | G3 | — | — | 40 | +132 | 7.8 | 300 |
| S23 | 37 | 33 | 30 | G3 | 4.0 | — | 39 | +53 | 7.7 | 200 |
| S24 | 37 | 33 | 30 | G3 | — | 4.0 | 39 | +51 | 7.7 | 200 |
| S25 | 43 | 37 | 20 | G4 | — | — | 51 | −155 | 7.0 | 100 |

TABLE 3

| | Ceramic | | Glass | | Ta$_2$O$_5$ | Nb$_2$O$_5$ | | | | |
|---|---|---|---|---|---|---|---|---|---|---|
| | TiO$_2$ (wt %) | CaTiSiO$_5$ (wt %) | (wt %) | Type | (part by weight) | (part by weight) | εr | TCC (ppmK$^{-1}$) | α (ppmK$^{-1}$) | Warp (μm) |
| S26 | 43 | 37 | 20 | G4 | 0.2 | — | 51 | −91 | 7.0 | 100 |
| S27 | 43 | 37 | 20 | G4 | 0.5 | — | 51 | −86 | 7.0 | 100 |
| S28 | 43 | 37 | 20 | G4 | 1.0 | — | 50 | −78 | 7.0 | 100 |

TABLE 3-continued

| | Ceramic | | Glass | | Ta₂O₅ (part by weight) | Nb₂O₅ (part by weight) | εr | TCC (ppmK⁻¹) | α (ppmK⁻¹) | Warp (μm) |
|---|---|---|---|---|---|---|---|---|---|---|
| | TiO₂ (wt %) | CaTiSiO₅ (wt %) | (wt %) | Type | | | | | | |
| S29 | 43 | 37 | 20 | G4 | 4.0 | — | 49 | −71 | 7.1 | 100 |
| S30 | 43 | 37 | 20 | G4 | 10.0 | — | 42 | −59 | 7.1 | 50 |
| S31 | 43 | 37 | 20 | G4 | 20.0 | — | 35 | −47 | 7.2 | 50 |
| S32 | 43 | 37 | 20 | G4 | 25.0 | — | 33 | −52 | 7.2 | 50 |
| S33 | 43 | 37 | 20 | G4 | — | 0.2 | 51 | −87 | 7.0 | 100 |
| S34 | 43 | 37 | 20 | G4 | — | 0.5 | 51 | −82 | 7.0 | 100 |
| S35 | 43 | 37 | 20 | G4 | — | 1.0 | 50 | −76 | 7.0 | 100 |
| S36 | 43 | 37 | 20 | G4 | — | 4.0 | 49 | −66 | 7.1 | 100 |
| S37 | 43 | 37 | 20 | G4 | — | 10.0 | 43 | −58 | 7.1 | 50 |
| S38 | 43 | 37 | 20 | G4 | — | 20.0 | 36 | −46 | 7.2 | 50 |
| S39 | 43 | 37 | 20 | G4 | — | 25.0 | 34 | −45 | 7.2 | 50 |
| S40 | 40 | 35 | 25 | G5 | — | — | 48 | −147 | 7.1 | 50 |
| S41 | 34 | 31 | 35 | G6 | — | — | 35 | −96 | 7.5 | 200 |
| S42 | 27 | 23 | 50 | G7 | — | — | 12 | +45 | 8.4 | 500 |
| S43 | 27 | 23 | 50 | G7 | 4.0 | — | 12 | +31 | 8.3 | 500 |
| S44 | 27 | 23 | 50 | G7 | — | 4.0 | 12 | +29 | 8.3 | 500 |
| *S45 | 24 | 21 | 55 | G7 | — | — | 9 | +50 | 8.3 | 400 |
| S46 | 40 | 35 | 25 | G8 | — | — | 44 | +146 | 7.0 | 200 |
| S47 | 40 | 35 | 25 | G8 | 4.0 | — | 43 | +62 | 7.5 | 200 |
| S48 | 40 | 35 | 25 | G8 | — | 4.0 | 43 | +59 | 7.5 | 200 |
| S49 | 40 | 35 | 25 | G9 | — | — | 43 | +142 | 7.5 | 200 |
| S50 | 37 | 33 | 30 | G10 | — | — | 41 | −125 | 7.6 | 200 |

TABLE 4

| | Ceramic | | Glass | | Ta₂O₅ (part by weight) | Nb₂O₅ (part by weight) | εr | TCC (ppmK⁻¹) | α (ppmK⁻¹) | Warp (μm) |
|---|---|---|---|---|---|---|---|---|---|---|
| | TiO₂ (wt %) | CaTiSiO₅ (wt %) | (wt %) | Type | | | | | | |
| S51 | 37 | 33 | 30 | G11 | — | — | 38 | −119 | 7.7 | 200 |
| S52 | 34 | 31 | 35 | G12 | — | — | 29 | −83 | 7.7 | 200 |
| S53 | 40 | 35 | 25 | G13 | — | — | 46 | −150 | 7.5 | 100 |
| S54 | 37 | 33 | 30 | G14 | — | — | 37 | +134 | 7.4 | 100 |
| S55 | 37 | 33 | 30 | G14 | 4.0 | — | 36 | +46 | 7.4 | 100 |
| S56 | 37 | 33 | 30 | G14 | — | 4.0 | 36 | +44 | 7.4 | 100 |
| S57 | 35 | 30 | 25 | G15 | — | — | 42 | −149 | 7.5 | 100 |
| S58 | 35 | 30 | 25 | G15 | 4.0 | — | 41 | −55 | 7.5 | 200 |
| S59 | 35 | 30 | 25 | G15 | — | 4.0 | 41 | −54 | 7.5 | 200 |
| S60 | 37 | 33 | 30 | G16 | — | — | 47 | −146 | 7.3 | 100 |
| S61 | 35 | 30 | 35 | G17 | — | — | 35 | −122 | 7.4 | 100 |
| S62 | 35 | 30 | 35 | G17 | 4.0 | — | 35 | −47 | 7.4 | 100 |
| S63 | 35 | 30 | 35 | G17 | — | 4.0 | 35 | −43 | 7.4 | 100 |
| S64 | 29 | 26 | 45 | G18 | — | — | 16 | −68 | 7.1 | 50 |
| S65 | 32 | 28 | 40 | G19 | — | — | 23 | −83 | 6.8 | 300 |
| S66 | 37 | 33 | 30 | G20 | — | — | 42 | +152 | 7.2 | 50 |
| S67 | 37 | 33 | 30 | G21 | — | — | 43 | −148 | 7.3 | 100 |
| S68 | 29 | 26 | 45 | G22 | — | — | 15 | −74 | 7.6 | 100 |
| S69 | 29 | 26 | 45 | G22 | 4.0 | — | 15 | −25 | 7.6 | 100 |
| S70 | 29 | 26 | 45 | G22 | — | 4.0 | 15 | −24 | 7.6 | 100 |
| S71 | 43 | 37 | 20 | G23 | — | — | 47 | −155 | 7.5 | 100 |
| S72 | 32 | 28 | 40 | G24 | — | — | 20 | −95 | 8.2 | 500 |
| S73 | 32 | 28 | 40 | G24 | — | — | 20 | −29 | 8.0 | 500 |
| S74 | 32 | 28 | 40 | G24 | — | — | 20 | −28 | 8.0 | 500 |

TABLE 5

| | Ceramic | | Glass | | | TCC | α | Warp |
|---|---|---|---|---|---|---|---|---|
| | (wt %) | Type | (wt %) | Type | εr | (ppmK⁻¹) | (ppmK⁻¹) | (μm) |
| *S75 | 60 | TiO₂ | 40 | G24 | 28 | −350 | 9.6 | Crack |
| *S76 | 60 | CaTiO₃ | 40 | G24 | 38 | −340 | 9.9 | Crack |
| *S77 | 60 | SrTiO₃ | 40 | G24 | 46 | −480 | 9.4 | Crack |
| S78 | 50 | Al₂O₃ | 50 | G1 | 7.8 | +150 | 7.2 | — |

As is clear from the evaluation results of Samples S75 to S77 shown in Table 5, glass ceramic sintered materials prepared by firing conventional glass ceramic compositions have large temperature coefficients of the dielectric constant. Since thermal expansion coefficients of these Samples are significantly larger than the thermal expansion coefficient of Sample S78, when each of green sheets containing these Samples and a green sheet containing Sample S78 are laminated, followed by firing, cracks occur in the glass ceramic sintered material.

On the other hand, as is clear from the evaluation results of Samples S2 to S13, S15 to S20, S22 to S44 and S46 to S74 shown in Table 2 and Table 3, the glass ceramics according to the present invention have small temperature coefficients of the dielectric constant. Since the thermal expansion coefficients of these Samples are close to the thermal expansion coefficient of Sample S78, when each of green sheets containing these Samples and a green sheet containing Sample S78 are laminated, followed by firing, warps in the glass ceramic can be reduced.

The $TiO_2$ content of Sample S1 exceeded about 75% by weight (or the content of $CaTiSiO_5$ was less than about 5% by weight). When a green sheet containing Sample S1 was fired together with a green sheet containing Sample S78, cracks occurred in the glass ceramic. On the other hand, the $TiO_2$ content of Sample S14 was less than about 5% by weight (or the content of $CaTiSiO_5$ exceeded about 75% by weight). When a green sheet containing Sample S14 was fired together with a green sheet containing Sample S78, cracks occurred in the glass ceramic.

Although the thermal expansion coefficient of Sample S14 was closer to that of Sample S78 than was the thermal expansion coefficient of Sample S1, cracks occurred in the glass ceramic containing Sample S14. The reason for this is that in the case where a high-dielectric-constant layer is held between low-dielectric-constant layers on both sides, as in the present example, and the thermal expansion coefficient of the high-dielectric-constant layer is larger than that of the low-dielectric-constant layer, a shrinking force in the plane direction is applied to the low-dielectric-constant layer. On the other hand, when the thermal expansion coefficient of the high-dielectric-constant layer is smaller than that of the low-dielectric-constant layer, a tensile force in the plane direction is applied to the low-dielectric-constant layer. In general, the ceramic has the strength characteristics that high resistance is exhibited against a shrinking force, and poor resistance is exhibited against a tensile force. Consequently, cracks occur in Sample S14.

Sample S21 was not sintered because the content of the glass was less than about 15% by weight. On the other hand, the dielectric constant of Sample S45 became too low because the content of the glass exceeded about 50% by weight.

As is clear from comparisons between Samples S4 and S5, when the $TiO_2$ content exceeds about 60% by weight (or the content of $CaTiSiO_5$ is less than about 20% by weight), the temperature coefficient of dielectric constant of the glass ceramic sintered material becomes too large a negative value. On the other hand, as is clear from comparisons between Samples S10 and S11, when the $TiO_2$ content is less than about 20% by weight (or the content of $CaTiSiO5$ exceeds about 60% by weight), the temperature coefficient of dielectric constant of the glass ceramic sintered material becomes too large a positive value.

Comparisons between Samples S9 and S10 show that when $Ta_2O_5$ is present, the temperature coefficient of dielectric constant of the glass ceramic sintered material becomes smaller. Likewise, as is clear from comparisons between Samples S9 and S11, when $Nb_2O_5$ is present, the temperature coefficient of dielectric constant of the glass ceramic sintered material becomes smaller.

As is clear from comparisons among Samples S26 to S32, when the $Ta_2O_5$ content exceeds about 4 parts by weight relative to 100 parts by weight of the primary components, the dielectric constant of the glass ceramic sintered material is reduced. Likewise, as is clear from comparisons among Samples S33 to S39, when the $Nb_2O_5$ content exceeds about 4 parts by weight relative to 100 parts by weight of the primary components, the dielectric constant of the glass ceramic sintered material is reduced.

Comparisons between Sample S15 and Sample S25 show that the glass ceramic sintered material including Sample S25 using the glass powder G4 containing ZnO has a smaller thermal expansion coefficient.

What is claimed is:

1. A glass ceramic composition comprising a primary component comprising about 5% to 75% by weight of $TiO_2$, about 5% to 75% by weight of $CaTiSiO_5$ and about 15% to 50% by weight of glass.

2. The glass ceramic composition according to claim 1, comprising about 20% to 60% by weight of $TiO_2$, about 20% to 60% by weight of $CaTiSiO_5$ and about 15% to 50% by weight of glass.

3. The glass ceramic composition according to claim 1, further a secondary component comprising at least one of $Ta_2O_5$ and $Nb_2O_5$.

4. The glass ceramic composition according to claim 3, wherein the secondary component is about 4 parts by weight or less relative to 100 parts by weight of the primary component.

5. The glass ceramic composition according to claim 1, wherein the glass comprises $SiO_2$, $B_2O_3$ and ZnO.

6. The glass ceramic composition according to claim 5, wherein the glass comprises about 5% to 50% by weight of $SiO_2$, about 5% to 60% by weight of $B_2O_3$ and about 5% to 65% by weight of ZnO.

7. The glass ceramic composition according to claim 5, wherein the glass further comprises an alkaline earth metal oxide.

8. The glass ceramic composition according to claim 7, wherein the glass comprises about 5% to 50% by weight of $SiO_2$, about 5% to 60% by weight of $B_2O_3$, about 5% to 65% by weight of ZnO and about 5% to 50% by weight of alkaline earth metal oxide.

9. A glass ceramic sintered material which is produced by firing a glass ceramic composition comprising about 20% to 60% by weight of $TiO_2$, about 20% to 60% by weight of $CaTiSiO_5$ and about 15% to 50% by weight of glass and in which $TiO_2$ crystals and $CaTiSiO_5$ crystals are present.

10. A ceramic multilayer substrate comprising a laminate of a first ceramic layer of the glass ceramic sintered material according to claim 9 and a second ceramic layer having a dielectric constant lower than that of the first ceramic layer.

11. The ceramic multilayer substrate according to claim 10, further comprising wiring conductors within the substrate.

12. The ceramic multilayer substrate according to claim 11, wherein the wiring conductors face each other with a first ceramic layer therebetween so as to form a capacitor.

13. A ceramic multilayer substrate comprising a laminate of a first ceramic layer of the glass ceramic sintered material according to claim 1 and a second ceramic layer having a dielectric constant lower than that of the first ceramic layer.

14. The ceramic multilayer substrate according to claim 13, further comprising wiring conductors within the substrate.

15. The ceramic multilayer substrate according to claim 14, wherein the wiring conductors face each other with a first ceramic layer therebetween so as to form a capacitor.

16. The ceramic multilayer substrate according to claim 15, wherein the second ceramic layer comprises alumina and borosilicate glass.

17. The ceramic multilayer substrate according to claim 16, wherein one or more first ceramic layers are sandwiched between second ceramic layers and the wiring conductors comprises copper or silver.

18. The ceramic multilayer substrate according to claim 13, wherein the second ceramic layer comprises alumina and borosilicate glass.

19. The ceramic multilayer substrate according to claim 13, wherein one or more first ceramic layers are sandwiched between second ceramic layers and the substrate further comprises at least one wiring conductor which comprises copper or silver.

* * * * *